(12) United States Patent
Mangone et al.

(10) Patent No.: US 12,286,537 B2
(45) Date of Patent: Apr. 29, 2025

(54) METHOD FOR CHEMICALLY ADHERING A DIENE RUBBER TO A PIEZOELECTRIC POLYMER

(71) Applicant: Apollo Tyres Global R&D B.V., Enschede (NL)

(72) Inventors: Carmela Mangone, Enschede (NL); Michel Klein Gunnewiek, Enschede (NL); Louis Reuvekamp, Enschede (NL); Wisut Kaewsakul, Enschede (NL); Anke Blume, Weilerswist (DE)

(73) Assignee: Apollo Tyres Global R&D B.V., Enschede (NL)

( * ) Notice: Subject to any disclaimer, the term of this patent is extended or adjusted under 35 U.S.C. 154(b) by 452 days.

(21) Appl. No.: 17/760,696

(22) PCT Filed: Sep. 15, 2020

(86) PCT No.: PCT/EP2020/075753
§ 371 (c)(1),
(2) Date: Mar. 15, 2022

(87) PCT Pub. No.: WO2021/052951
PCT Pub. Date: Mar. 25, 2021

(65) Prior Publication Data
US 2022/0403143 A1    Dec. 22, 2022

(30) Foreign Application Priority Data
Sep. 16, 2019   (LU) .................................. LU101394

(51) Int. Cl.
*C08L 9/00*      (2006.01)
*B60C 1/00*      (2006.01)
*H10N 30/063*    (2023.01)

(52) U.S. Cl.
CPC .............. *C08L 9/00* (2013.01); *B60C 1/0008* (2013.01); *H10N 30/063* (2023.02); *C08L 2203/20* (2013.01); *C08L 2312/02* (2013.01)

(58) Field of Classification Search
None
See application file for complete search history.

(56) References Cited

U.S. PATENT DOCUMENTS 5,879,757 A * 3/1999 Gutowski .................. C08J 7/12
                                                    427/601
6,752,894 B2 * 6/2004 Jing ........................... C08J 7/12
                                                    427/508

(Continued)

FOREIGN PATENT DOCUMENTS

CN   208180681 U   12/2018
EP   1605528 A2   12/2005

(Continued)

OTHER PUBLICATIONS

Miyoshi_machine_translation (Year: 2013).*

(Continued)

*Primary Examiner* — Michael N Orlando
*Assistant Examiner* — Abhishek A Patwardhan
(74) *Attorney, Agent, or Firm* — Renner, Otto, Boisselle & Sklar, LLP

(57) ABSTRACT

The present invention relates to a method for chemically adhering a diene rubber to a piezoelectric polymer, the method comprising the steps of: a) providing a piezoelectric polymer having at least one surface, b) providing a rubber component having at least one surface and comprising a sulfur cross-linkable rubber composition, c) introducing oxygen-containing functional groups on the at least one surface of the piezoelectric polymer, d) reacting the oxygen-containing functional groups with a compound comprising thiocyanate groups, and e) contacting the surface of the (Continued)

piezoelectric polymer obtained of step d) with the surface of the rubber component, and cross-linking.

15 Claims, 2 Drawing Sheets

(56) References Cited

U.S. PATENT DOCUMENTS

| | | | |
|---|---|---|---|
| 6,844,030 B2* | 1/2005 | Jing | C08J 7/12 |
| | | | 427/508 |
| 11,766,842 B2* | 9/2023 | Seto | B60C 5/14 |
| | | | 152/510 |
| 2007/0010928 A1* | 1/2007 | Brusarosco | G01G 19/025 |
| | | | 340/444 |
| 2013/0127299 A1 | 5/2013 | Kim et al. | |
| 2015/0329708 A1* | 11/2015 | Tanabe | C08L 21/00 |
| | | | 523/156 |

FOREIGN PATENT DOCUMENTS

| | | | | |
|---|---|---|---|---|
| EP | 2786595 B1 | 9/2017 | | |
| JP | 2013021176 A | * | 1/2013 | ......... H01L 41/0478 |
| KR | 101668104 B1 | 10/2016 | | |
| KR | 20190029829 A | 3/2019 | | |
| WO | 2018069680 A1 | 4/2018 | | |

OTHER PUBLICATIONS

International Search Report and Written Opinion for Application No. PCT/EP2020/075753 mailed Nov. 30, 2020.
D.M. Correi, et al. "Progress in Organic Coatings",vol. 85, Aug. 2015, pp. 151-158,Influence of oxygen plasma treatmentparameters on poly(vinylidene fluoride)electrospun fiber mats wettability https://doi.org/10.1016/j.porgcoat.2015.03.019.

\* cited by examiner

METHOD FOR CHEMICALLY ADHERING A DIENE RUBBER TO A PIEZOELECTRIC POLYMER

This application is a national phase of International Application No. PCT/EP2020/075753 filed Sep. 15, 2020, which claims priority to Luxembourg Application No. LU101394 filed Sep. 16, 2019, the entire disclosures of which are hereby incorporated by reference.

Thermoplastic polymer is a polymer able to be moldable since they soften at a proper range of temperature. Upon cooling, they harden and at low temperature, they have glass-like structure. Polyvinylidene fluoride, PVDF, is a fluorinated and semi-crystalline polymer prepared by radical polymerization of vinylidene fluoride. It is mostly used in the form of a powder or a film in the piping and cable industry thanks to its tensile module (1-3 GPa) and chemical stability and in other applications in which solvent/acids/basic resistance and heat resistance are required. PVDF has four different phases with different chain conformations:

- The α-phase is non polar and is characterized by chains packed in an anti-parallel way. It is the most common structure, and is obtained by cooling down from the melt or by casting from solution;
- The β-phase is a highly polar phase and is characterized by a planar zigzag conformation and a net crystalline dipole. The β-phase is used for its piezoelectric properties, which means that it generates an electrical current under mechanical strain or conversely, it changes its shape under applied electric field. This phase is obtained by applying a mechanical stress and a high electric field above the melt, and subsequently cooling down;
- γ, δ and ε phases are less present in the structure, and they also can be obtained by the casting solution method or by applying an electric field in a similar fashion as mentioned with the β-phase.

Therefore, PVDF is used in a wide range of applications, e.g. bearings, linings, vessels, automotive materials, actuators or sensors. Most of these applications require adhesion between PVDF and a rubber. However, PVDF, like other fluoropolymers, has a very low surface energy and in turn a high chemical resistance and poor adhesion properties to rubbers. Thus, adhesion of PVDF needs to be increased.

WO 2018/069680 A1 describes a laminated piezoelectric device, wherein the laminated piezoelectric device may comprise as an piezoelectric polymer PVDF or a copolymer of PVDF that is laminated to a circuit sheet using an adhesive sheet. The adhesive may be an epoxy, acrylic or polyimide adhesive.

EP 1 605 528 A2 describes a plurality of elongated piezoelectric structures that can be configured into a patch and may alternatively be provided in an additional rubber or elastomer casing to provide additional protection before being adhered to or embedded in a tire. The adhesion of PVDF is not addressed.

EP 2 786 595 B1 describes an electromechanical microspeaker device comprising a deformable membrane, the deformable membrane including a piezoelectric layer sandwiched between first and second conductive layers. The formation of the piezoelectric layer can include deposition of polyvinylidene fluoride (PVDF), but adhesion of PVDF is not addressed.

Using adhesive layers however impairs the conductivity between the piezoelectric layer and the conductive layers in a piezoelectric device. The present invention has the object to provide a method for adhering a piezoelectric polymer such as PVDF to a diene rubber.

This object is achieved by the method according to claim 1, and a tyre according to claim 14. Advantageous embodiments are the subject of the dependent claims. They may be combined freely unless the context clearly indicates otherwise.

Accordingly, a method for chemically adhering a diene rubber to a piezoelectric polymer is provided, the method comprising the steps of:
a) providing a piezoelectric polymer having at least one surface,
b) providing a rubber component having at least one surface and comprising a sulfur cross-linkable rubber composition,
c) introducing oxygen-containing functional groups on the at least one surface of the piezoelectric polymer,
d) reacting the oxygen-containing functional groups with a compound comprising thiocyanate groups, and
e) contacting the surface of the piezoelectric polymer obtained of step d) with the surface of the rubber component, and cross-linking.

It has surprisingly been found that high adhesive strength is obtained between a PVDF film and a rubber after surface treatment of the piezoelectric polymer and reacting with a compound comprising thiocyanate groups, like silane, without any treatment of the rubber. The adhesive method thus provides a piezoelectric polymer with improved adhesive properties to a non-polar rubber after surface treatment.

The piezoelectric polymer may be selected from the group of polyvinylidene fluoride (PVDF) polymer or co-polymers selected from polyvinylidene fluoride (PVDF), polyvinylidene fluoride-trifluoroethylene (P(VDF-co-TrFE)) copolymer, poly(vinylidene fluoride-co-hexafluoropropylene) (P(VDF-co-HFP)), poly(vinylidene fluoride-co-chlorotrifluoroethylene) (P(VDF-co-CTFE)), or a polyamide, liquid crystal polymer or poly(p-xylylene) (Parylene-C) and mixtures of these polymers. Polymers from the PVDF family, particularly the group of PVDF and P(VDF-co-TrFE), P(VDF-co-HFP), and P(VDF-co-CTFE) copolymers, are preferred. Among the piezopolymers, PVDF and its copolymer have the highest piezoelectric charge coefficients.

In embodiments, oxygen-containing functional groups on the surface of the piezoelectric polymer can be provided by treatment with oxygen plasma. Oxygen plasma treatment allows a complete oxygen functionalization of the uppermost surface layer of a polymer such as PVDF. Oxygen plasma treatment may be carried out in a plasma vacuum chamber. Oxygen plasma treatment is also possible without a vacuum chamber and/or use of an oxygen plasma torch. The reaction time for oxygen plasma treatment depends on the settings during the plasma treatment, such as vacuum, amount of oxygen used, etc. Preferably, the treatment covers the surface completely with reactive sites. Oxygen plasma treatment may be carried out for a time period in a range of from 5 minutes to 1 hour. Preferably, the oxygen plasma treatment is carried out for at least 15 minutes.

Oxygen-containing functional groups on the surface of the piezoelectric polymer can be provided by treatment with other oxidizing agents, such as acids or alkaline treatment that can also create oxide or hydroxyl groups on the surface which can react afterwards with a silane. For example, a PVDF surface can be treated with high concentration NaOH solution (7.5 M) under high temperatures such as about 70° C. to generate hydroxyl functional groups on PVDF polymer chains.

In a next step, the oxygen-containing functional groups are reacted with a compound comprising thiocyanate groups. The sulphur of the thiocyanate group will participate in the cross-linking reaction between the sulfur cross-linkable rubber in step e), for example the during the vulcanization reaction of the rubber, and therefore provide for the adhesion between the two layers of otherwise non-reactive piezoelectric polymer and rubber. Generally, rubber compositions and polymer blends, e.g., those used to produce tyres, are crosslinked. Rubber compositions and polymer blends may be crosslinked by adding curative molecules, for example sulfur, followed by heating.

In embodiments, reacting the oxygen-containing functional groups in step d) is a silanisation of an oxygen-treated surface or analkaline-treated surface with a silane comprising thiocyanate groups and ethoxy and/or methoxy groups. The silane comprising thiocyanate groups and ethoxy and/or methoxy groups may be selected from the group of trimethoxy(3-thiocyanatopropyl)silane or triethoxy(3-thiocyanatopropyl)silane and mixtures thereof. The silane further may be selected from the group of Bis(triethoxysilylpropyl)tetrasulfide (TESPT), Bis(3Triethoxysilylpropyl) disulphide (TESPD), 3-mercaptopropyltri-methoxysilane (MTMO), (3-Mercaptopropyl)triethoxysilane (MPTES), 3-mercaptopropyl-di(tridecan-1-oxy-13-penta(ethyleneoxide)) ethoxysilane (VP Si363), 3-octanoylthio-1-propyltriethoxysilane (NXT), thiocyanatosilane (TCPTEO), vinyltriethoxysilane (VTEO), Vinyltris(2-methoxyethoxy)silane (VTMOEO), 3-chloropropyltrimethoxysilane (CPTEO), 3-methacryloxypropyl-trimethoxysilane (MEMO), 3-aminopropyltriethoxysilane (AMEO), propyltriethoxysilane (PTEO), octyltriethoxysilane (OCTEO).

The reaction time for the silanisation depends on the settings during the treatment. Preferred is a silanization in vacuum, but it can be done from solution as well, which changes the reaction time. Preferably, the treatment covers the surface completely. Silanisation may be carried out from really short to long times. The silanisation may be carried out for a time period in a range of $\geq 1$ minute to $\leq 2$ days, preferably a range of $\geq 23$ hours to $\leq 25$ hours. Silanisation in vacuum for a time period of 23, 24 or 25 hours provided good results.

Another usable compound comprising thiocyanate groups with which the oxygen-containing functional groups may be reacted with is the compound 2-(3,4-dihydroxyphenyl)-2-oxoethyl ester thiocyanic acid, a catechol based chemical.

A preferred embodiment of the method includes an oxygen plasma treatment and a silanization step with a thiocyanato-silane. The oxygen plasma treatment is capable of inserting chemically reactive, oxide-based groups on material surface, promoting the immobilization of different components onto the polymer surface. The silanization is a chemical reaction during which a PVDF film is functionalized and covered by a silane. The selected silane preferably has reactive groups that will attach to PVDF and another group that can participate in a vulcanization process of an unvulcanized rubber. Advantageously, surface treatment of PVDF by means of a plasma treatment of the polymeric film, and by subsequent silanization of the plasma-treated film can improve the adhesion between a PVDF film and a rubber, without inner structural changes of the PVDF polymer.

The rubber may be a diene rubber selected from the group of natural rubber (NR), isoprene rubber (IR), polybutadiene rubber (BR), styrene-butadiene rubber (SBR) or a mixture thereof. The rubber may be a blend of natural rubber (NR) and polybutadiene rubber (BR).

The rubber composition may be an electrically conductive rubber composition comprising a conductive component selected from the group of carbon black, single-wall carbon nanotubes (SWCNT) or multi-wall carbon nanotubes (MWCNT), graphene or a mixture thereof. Single or multi-wall carbon nanotubes and graphene also are referred to as nano-fillers. Preferred are carbon black and/or nano-fillers, e.g. single or multi-wall carbon nanotubes. Preferably, the rubber composition comprises carbon black and SWCNT.

The term "Single-wall carbon nanotubes" or "SWNTs" refers to a class of carbon materials known as one-dimensional materials. They are formed of sheets of graphene, rolled up to form hollow tubes with walls one atom thick. (SWCNTs) usually have diameters in the range of a nanometer. A range of SWNTs with different purities, lengths and wall types is commercially available. The term "multi-wall carbon nanotubes" or "MWCNTs" refers to a form of carbon nanotubes in which multiple single-walled carbon nanotubes are nested inside one another. A range of SWNTs with different diameters is commercially available. The term "graphene" refers to a two-dimensional carbon allotrope, wherein single layers of sp2-bonded carbon atoms are arranged in a hexagonal lattice. The electrically conductive rubber composition may comprise single-wall carbon nanotubes (SWCNT) in a range of $\geq 0.01$ wt % to $\leq 2$ wt %, preferably a range of $\geq 0.1$ wt % to $\leq 0.6$ wt %, based on a total weight of 100 wt % of the sulfur cross-linkable rubber composition. The electrically conductive rubber composition may comprise at least one diene rubber, a carbon black filler and single wall carbon nanotubes in an amount in a range of $\geq 0.2$ wt % to $\leq 0.6$ wt %. For use in a rubber composition, SWCNT may be provided suspended in a rubber process oil such as treated distillate aromatic extracts (TDAE). Such mixtures may comprise 10 wt % SWCNT in TDAE. The rubber composition may comprise, per hundred parts by weight of rubber (phr), such as paste of SWCNT in TDAE in a range of $\geq 0.2$ phr to $\leq 40$ phr, preferably a range of $\geq 3.5$ phr to $\leq 12$ phr. The electrically conductive rubber composition may comprise carbon black in a range of $\geq 1$ phr to $\leq 150$ phr, preferably a range of $\geq 50$ phr to $\leq 80$ phr.

In preferred embodiments, the method is for producing a piezoelectric device, the method comprising the steps of:
a) providing a piezoelectric polymer having first and second opposing surfaces,
b) providing a first and a second rubber component each having at least one surface and each comprising a sulfur cross-linkable electrically conductive rubber composition,
c) introducing oxygen-containing functional groups on the first and second surface of the piezoelectric polymer,
d) reacting the oxygen-containing functional groups with a compound comprising thiocyanate groups, and
e) contacting the first and second opposing surfaces of the piezoelectric polymer obtained of step d) with the surfaces of the first and second rubber component each comprising a sulfur cross-linkable electrically conductive rubber composition, whereby the piezoelectric polymer is sandwiched between the sulfur cross-linkable rubber surfaces, and cross-linking.

As described above, treating the surfaces of a PVDF polymer or co-polymer film with oxygen plasma, and silanisation of the oxygen-treated surfaces with a silane comprising thiocyanate groups and ethoxy and/or methoxy groups is preferred.

The piezoelectric polymer such as polyvinylidene fluoride (PVDF) polymer or co-polymer may have the form of a film or layer or may have any other form. First and second rubber component may have the form of a sheet or layer or may have any other form.

In embodiments, the piezoelectric polymer, preferably a PVDF polymer or co-polymer, and the first and second rubber component may each have the form of a layer. In this embodiment in step e) the piezoelectric polymer layer is sandwiched between the conductive rubber layers, and cross-linking results in a three-layered piezoelectric device. Thus, a piezoelectric device may be obtained by the method, wherein the piezoelectric device has a sandwich-like configuration comprising a first conductive rubber layer and a second conductive rubber layer, and a piezoelectric polymer layer provided between the first and second conductive rubber layers. Such a three-layered piezoelectric device is usable separate of a tyre or may be attached using an adhesive such as an amino silane sealant to a component of a tyre such as an inner liner.

In an embodiment, the piezoelectric polymer, preferably a PVDF polymer or co-polymer, and the first rubber component comprising a sulfur cross-linkable electrically conductive rubber composition have the form of a layer while the second rubber component is a rubber component of a tyre. The second rubber component also comprises a sulfur cross-linkable electrically conductive rubber composition. In this embodiment in step e) the piezoelectric polymer layer is sandwiched between the conductive rubber layer and the conductive rubber component of the tyre.

In an embodiment, the piezoelectric polymer, preferably a PVDF polymer or co-polymer, and first and second rubber component each have the form of a layer, and the second rubber component has a second surface contacting an electrically conductive or non-conductive rubber component of a tyre. After cross-linking in step e) a three-layered structure of the piezoelectric polymer layer sandwiched between first and second conductive rubber layers is contacted to the rubber component of the tyre. Since the second rubber component is formed from a conductive rubber composition, it provides conductivity to the piezoelectric device and the component of the tyre need not be conductive.

In preferred embodiments, the rubber component of the tyre is an inner liner.

In embodiments, the cross-linking in step e) is carried our when cross-linking the rubber components of the tyre. Cross-linking may be carried out as a usual vulcanization temperature, for example at 120° C.

The present invention also encompasses a tyre comprising a piezoelectric device, obtained by the method according to the invention.

Weight percent, weight-% or wt-%, are synonyms and are calculated on the basis of a total weight of 100 weight % of the respective object, if not otherwise stated. The total amount of all components of the respective object does not exceed 100 wt.-%.

EXAMPLES

The invention will be further described with reference to the following examples and figures without wishing to be limited by them.

EXAMPLE 1: PREPARATION OF PIEZOELECTRIC DEVICES

Step 1.1 Providing a Piezoelectric Polymer

Figure 1:
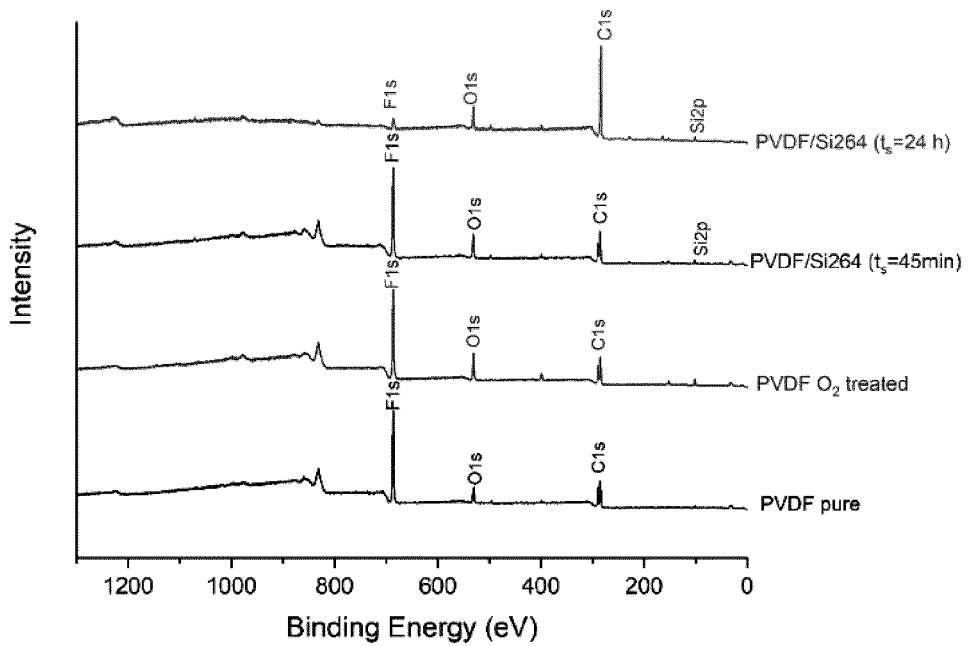
FIG. 1 shows the XPS spectra of pure PVDF film, and PVDF films after oxygen plasma treatment and silanization by thiocyanate-silane.

The piezoelectric polymer PVDF was supplied from PolyK Technologies LLC, USA, in a form of thin film with A4 in size and a thickness of 100 μm. The electrical and chemical properties of this polymer film are shown in the following Table 1.

TABLE 1

Properties of the PVDF film as provided by the supplier PolyK Technologies LLC:
PVDF film with 100 μm thickness

| Properties | Value |
| --- | --- |
| Charge coefficient, $d_{31}$ | 30 pC/N |
| Charge coefficient, $d_{33}$ | −30 pC/N |
| Melting Temperature | 170-175° C. |
| Tensile strength* | 400-600 MPa |
| Young Modulus* | 2300 MPa |
| Elongation at break* | 20-30% |

Step 1.2 Providing Rubber Components Having at Least One Surface and Comprising a Sulfur Cross-Linkable Rubber Composition Non vulcanized rubber sheets of four different conductive rubber compositions $C_{ref}$, $C_1$, $C_2$ and $C_3$, were prepared according to the table 2 below:

TABLE 2 components of conductive rubber compositions $C_{ref}$, $C_1$, $C_2$ and $C_3$

| Component: | $C_{ref}$ amount (phr) | $C_1$ amount (phr) | $C_2$ amount (phr) | $C_3$ amount (phr) |
| --- | --- | --- | --- | --- |
| NR | 25 | 25 | 25 | 25 |
| SBR | 25 | 25 | 25 | 25 |
| BR | 50 | 50 | 50 | 50 |
| Filler | 60 | 60 | 60 | 60 |
| Processing oil | 14 | 14 | 14 | 14 |
| Curing agent | 10 | 10 | 10 | 10 |
| Anti Degradation agent | 7 | 7 | 7 | 7 |
| SWCNT/TDAE (10 wt % SWCNT in TDAE) | 0 | 4 | 8 | 12 |

The NR rubber used was TSR 20 grade.

The SBR rubber used was SBR 1502.

The BR rubber used was a Ni catalyzed Butadiene Rubber.

The filler used was carbon black N 330.

Abbreviations used are: TDAE (treated distillate aromatic extract; processing oil); SWCNT (Single Wall Carbon Nanotubes.

The mixture denoted $C_{ref}$ comprised carbon black as conductive component. In the three samples denoted $C_1$, $C_2$ and $C_3$, respectively, 2, 4 and 6 wt % of a paste of highly conductive nano-fillers comprising 10 wt % of Single Wall Carbon Nanotubes (SWCNT) in a low aromatic plasticizer (TDAE) was added to the mixture $C_{ref}$ via a two roll-mill to improve conductivity. For good dispersion of the nano-fillers, the compound was passed and rolled in the mills for ten times.

Step 1.3: Introducing Oxygen-Containing Functional Groups on the Surfaces of the Piezoelectric Polymer The PVDF surface was cleaned by chloroform (99.5%, Sigma-Aldrich, St. Louis, MO) before treatment with oxygen plasma. The cleaned PVDF film was treated with an oxygen plasma treatment using a Plasma-Prep II (SPI Supplies, West Chester, USA) that contained a plasma vacuum chamber, in which the PVDF film was placed. A mechanical vacuum pump (Oerlikon, Lafert S.p.A., Italy) reduced the pressure inside the chamber to around 100-200 mTorr. At the optimal pressure, oxygen gas was pumped into the chamber. RF power at 13.56 MHz was applied to the chamber. This excited and charged the oxygen molecules and therefore created the oxygen plasma radicals ready to react on the PVDF surface. The PVDF film was continually treated for 15 minutes at room temperature (20±5° C.).

Scheme 1 Chemical functionalities on the surface of PVDF film after $O_2$ plasma treatment

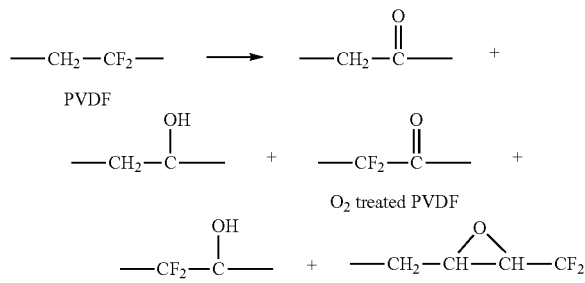

Step 1.4: Silanisation of the Oxygen-Treated Surface with a Silane Comprising Thiocyanate Groups and Ethoxy and/or Methoxy Groups After oxygen treatment the PVDF was silanised with a thiocyanate based silane, namely 3-thiocyanatopropyltriethoxysilane (Si-264, Evonik Industries AG, Germany).

Scheme 2 Chemical structure of 3-thiocyanatopropyltriethoxysilane, Si-264.

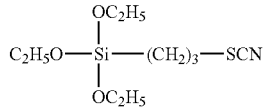

The physical and chemical properties of Si-264 as provided by the supplier Evonik Industries AG are summarised in Table 3 below.

TABLE 3

| Physical and chemical properties of Si-264. | |
|---|---|
| Si 264 | |
| Sulphur Content | 12.5% |
| Average molecular weight | 263 g/mol |
| Density | 1.00 g/cm³ |

For the silanization procedure, the PVDF film and silane S-264 were introduced into a desiccator under a vacuum atmosphere at room temperature for 24 hours. Inside the desiccator, the film was fixated with a holder to fully expose the surface of the film to silane reactive vapour. 3 ml of Si-264 silane was kept into a small Petri dish and placed close to the film.

The ethoxy groups of the silane reacted with the active functionalities on PVDF surface with released ethanol as a by-product. Another end group was thiocyanate group introducing sulphur atom to the surface of the film which can react with rubber molecules during vulcanization, expected to give chemical bonds or strong adhesion to the interfaces as shown in scheme 3 below.

Scheme 3 Chemical structure of silane-modified PVDF flilm

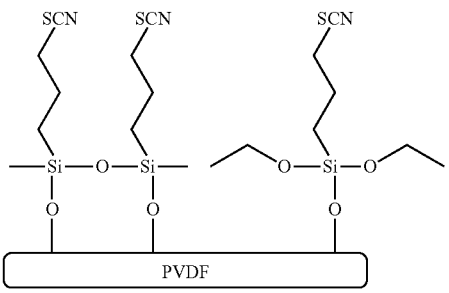

Step 1.5: Contacting the Oxygen-Treated and Silanised Surface of the Piezoelectric Polymer with the Surface of the Rubber Components, and Cross-Linking Vice To prepare piezoelectric devices, the silanized PVDF film of step 1.4 was cured together with the layers of conductive rubber compound of step 1.2. The vulcanization behaviour of the compounds was analysed using a Rubber Process Analysis (RPA 2000, Alpha Technologies, USA). The optimal cure time, i.e. the time, when the cure torque reaches 90% of the maximum cure state, known as $t_{c90}$, was taken as an input for the vulcanization step. The samples were cured at 100 bar in a Wickert press (Landau in der Pfalz, Germany) to the measured optimal cure time and temperature.

Four piezoelectric patches were fabricated in a sandwich configuration with the 0.1 mm thick PVDF film inserted in between two sheets of conductive rubber compounds $C_{ref}$, and $C_1$, $C_2$ and $C_3$, respectively, and cured. The resulting cylindrical specimen had a sandwich-like configuration with a diameter of 10 mm and a thickness of 4,1 mm. In the following, the resulting piezoelectric devices are denoted $C_{ref}$, $C_1$, $C_2$ and $C_3$ according to the respective conductive compounds. The chemical bonds, adhesive strength and bond stability between the two components were investigated using an X-ray photoelectron spectroscopy (XPS), a T-Peel test using a universal tensile testing machine, respectively.

EXAMPLE 2: DETERMINATION OF THE SURFACE FUNCTIONALISATION OF THE PVDF SURFACE

In order to confirm the chemical modification on the PVDF surface, XPS spectroscopy was used to analyze the surface chemistry. Chemical components on the surface of PVDF film before treatment, after oxygen plasma treatment and after silane-treatment were analysed using an X-ray photoelectron spectroscopy or XPS (Quantera SXM, USA). The XPS measurements were performed before and after surface treatment with oxygen plasma and after salinization with thiocyanate silane with two different reaction times, i.e. 45 minutes and 24 hours. The PVDF films were irradiated with a monochromatic x-ray beam, i.e. Al with Kα=1486.6 eV, and a spot size of 100 μm. Each spectrum was compared with the spectra of the pure PVDF without treatment that was washed and cleaned with chloroform before analysis. All samples were analysed on four different points to compare the peak area and quantify the standard deviation of the values.

FIG. 1 shows the spectra of pure PVDF, O2-treated PVDF and silanized PVDF using two different silanization times, i.e. 45 min and 24 hours. Table 4 summarises the peak area of the specific elements with standard deviations from each spectrum.

TABLE 4

Integral peak area of elements on the surface of PVDF films derived from XPS analysis.

| Sample | C 1s Peak Area | N 1s Peak Area | O 1s Peak Area | F 1s Peak Area | Si 2p Peak Area |
|---|---|---|---|---|---|
| PVDF pure | 54.20 | 1.35 | 8.66 | 33.24 | 2.05 |
| PVDF/O$_2$- plasma | 48.54 | 5.01 | 11.32 | 30.37 | 4.42 |
| PVDF/Si 264 (45 min) | 49.69 | 2.01 | 13.19 | 29.09 | 4.56 |
| PVDF/Si 264 (24 h) | 77.75 | 2.85 | 10.97 | 1.11 | 4.31 |

As can be taken from the FIG. 1, the PVDF film purified with chloroform showed an outstanding peak of fluorine (F) at 688 eV with an integral area of 33.2, i.e. 33.2 atomic percent, and two peaks of carbon (C) at 286 to 290 eV with a peak area of 54.2, i.e. an amount of 54.2 atomic percent. The spectrum of pure PVDF showed a small peak of oxygen (O) at 533 eV, but the spectrum of O$_2$-treated PVDF showed an increased concentration of oxygen on the surface, the integral area and thus the elemental composition was increased from 8.7 to 11.3. Due to increasing the silanization time from 45 minutes to 24 hours, the amount of F remarkably decreased from 29.09 to 1.11 atomic percent. This confirms that the fluorine atoms were replaced and covered by silane molecules, giving the silane-modified surface of PVDF film.

It is assumed that the ethoxy groups of the silane reacted with the active functionalities on the PVDF surface, while the thiocyanate group which introduced sulphur atom to the surface of the film, was able to react with rubber molecules during vulcanization.

EXAMPLE 3: DETERMINATION OF ADHESIVE STRENGTH BETWEEN PVDF AND CONDUCTIVE RUBBER

Adhesive strength between the PVDF film and the elastomeric compounds was investigated using a T-peel test. The adhesion test performed was according to ASTM D413 test standard, which is, in particular, for the application of rubber property-adhesion to flexible substrate. The measurement was carried out using a tensile testing machine (Zwick Z1.0, Zwick/Roell Nederland, the Netherlands), following the test standard described in ISO 5893.

Figure 2:
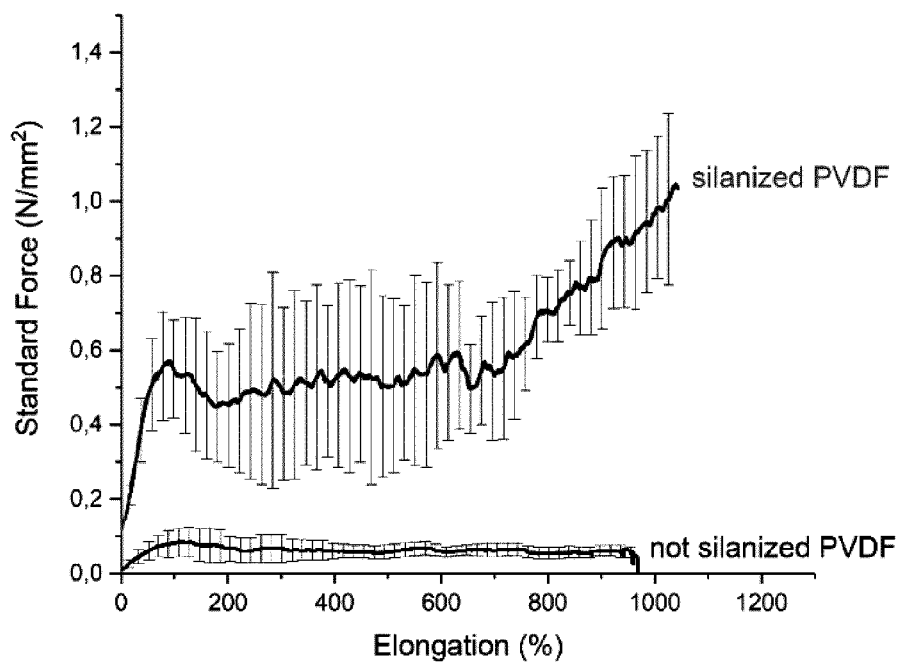
FIG. 2 shows a peel test of cured samples prepared from silanized PVDF/conductive rubber and non-silanized PVDF/conductive rubber.

The composition $C_{ref}$ was used for the T-peel test study and a comparison between test specimen of cured two-layered samples of non-silanized PVDF/conductive rubber $C_{ref}$ and silanized PVDF/conductive rubber $C_{ref}$ was made. Five samples were tested and the data were averaged. FIG. 2 shows the forces used to peel the two components of the respective specimen apart. As can be taken from the FIG. 2, the results show that surface modification of the PVDF film by silane significantly improves the adhesion between PVDF and the conductive rubber compound.

EXAMPLE 4: DETERMINATION OF THE DURABILITY OF THE ADHESION BETWEEN PVDF AND CONDUCTIVE RUBBER

Durability of the piezoelectric device is very important since a tyre will be used for several years. Thus, the piezoelectric device needs to have good durability under the dynamic mechanical conditions in a pneumatic tyre. Since the piezo-patch PVDF/$C_{ref}$ has to withstand the rolling conditions of tyres, a time sweep analysis DMA (Dynamic Mechanical Analysis) technique with double shear deformation mode was carried out. The dynamic mechanical conditions were measured according to ASTM D5418-99. A sandwich patch was prepared into the double shear sample and tested with a DMA Eplexor9 (Netzsch Gabo Instruments GmbH, Ahlden, Germany). With this mode, two piezoelectric sandwich patches (10 mm width and 4 mm length) were glued using a cyanoacrylate adhesive (Sicomet 7000, Henkel AG, Germany) to three metal cylinders. After that, the sample was clamped horizontally in the DMA and the double shear mode test was performed to check the durability.

Figure 3:
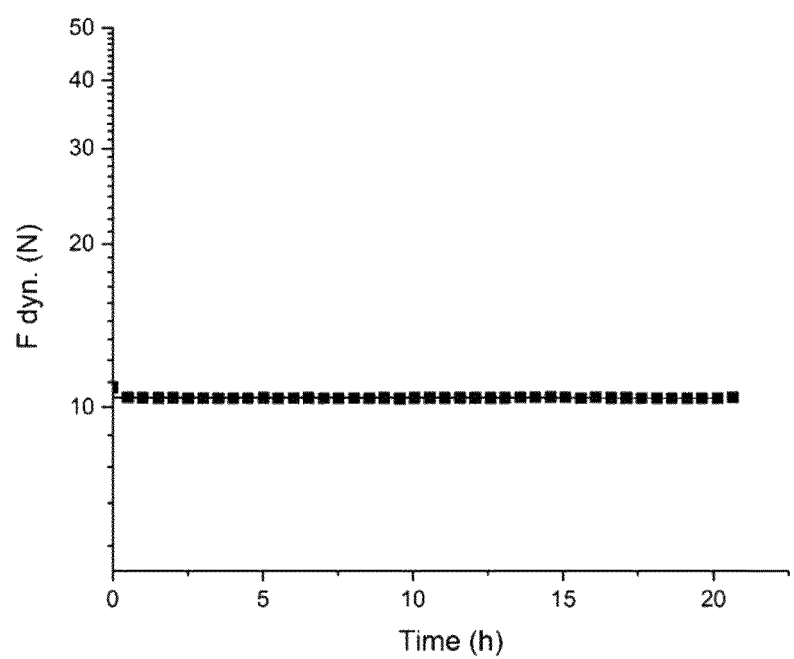
FIG. 3 shows the result of a fatigue test of the piezoelectric patch in a sandwich configuration of PVDF/$C_{ref}$ using a time sweep analysis with a double shear mode at 2% dynamic strain.

FIG. 3 shows the results from durability test of the piezoelectric sample under a dynamic mechanical condition with a double shear mode technique.

As can be taken from the FIG. 3, owing to a constant dynamic strain applied during the measurement, a constant value of the dynamic force was observed over the testing time. This shows that the adhesion between the PVDF film and the conductive rubber compound $C_{ref}$ was rather stable. This confirms that the adhesion between the components of the piezoelectric patch is reliable.

The invention claimed is:

1. A method for chemically adhering a diene rubber to a piezoelectric polymer, the method comprising the steps of:
   a) providing a piezoelectric polymer having at least one surface,
   b) providing a rubber component having at least one surface and comprising a sulfur cross-linkable rubber composition,
   c) introducing oxygen-containing functional groups on the at least one surface of the piezoelectric polymer,
   d) reacting the oxygen-containing functional groups with a compound comprising thiocyanate groups, and
   e) contacting the at least one surface of the piezoelectric polymer obtained of step d) with the at least one surface of the rubber component, and cross-linking.

2. The method according to claim 1, wherein oxygen-containing functional groups are provided by treatment with oxygen plasma.

3. The method according to claim 1, wherein the reacting the oxygen-containing functional groups in step d) is a silanisation of an oxygen-treated surface with a silane comprising thiocyanate groups and ethoxy and/or methoxy groups.

4. The method according to claim 1, wherein the silane comprising thiocyanate groups and ethoxy and/or methoxy groups is selected from the group of trimethoxy (3-thiocyanatopropyl) silane or triethoxy (3-thiocyanatopropyl) silane and mixtures thereof.

5. The method according to claim 3, wherein the silanisation is carried out for a time period in a range of ≥1 minute to ≤2 days.

6. The method according to claim 1, wherein the piezoelectric polymer is selected from the group consisting of polyvinylidene fluoride (PVDF) polymer or co-polymers selected from polyvinylidene fluoride (PVDF), polyvinylidene fluoride-trifluoroethylene (P(VDF-co-TrFE)) copolymer, poly(vinylidene fluoride-co-hexafluoropropylene) (P(VDF-co-HFP)), poly(vinylidene fluoride-co-chlorotrifluoroethylene) (P(VDF-co-CTFE)), or a polyamide, liquid crystal polymer or poly(p-xylylene), and mixtures of these polymers.

7. The method according to claim 1, wherein the rubber is a diene rubber selected from the group of natural rubber (NR), isoprene rubber (IR), polybutadiene rubber (BR), styrene-butadiene rubber (SBR) or a mixture thereof.

8. The method according to claim 1, wherein the rubber composition is an electrically conductive rubber composition comprising a conductive component selected from the group consisting of carbon black, single-wall carbon nanotubes or multi-wall carbon nanotubes), graphene or a mixture thereof.

9. The method according to claim 8, wherein the electrically conductive rubber composition comprises single-wall carbon nanotubes in a range of ≥0.01 wt % to ≤2 wt % based on a total weight of 100 wt % of the sulfur cross-linkable rubber composition.

10. A method for chemically adhering a diene rubber to a piezoelectric polymer, wherein the method is for producing a piezoelectric device, the method comprising the steps of:
  a) providing a piezoelectric polymer having first and second opposing surfaces,
  b) providing a first and a second rubber component each having at least one surface and each comprising a sulfur cross-linkable electrically conductive rubber composition,
  c) introducing oxygen-containing functional groups on the first and second opposing surfaces of the piezoelectric polymer,
  d) reacting the oxygen-containing functional groups with a compound comprising thiocyanate groups, and
  e) contacting the first and second opposing surfaces of the piezoelectric polymer obtained of step d) with the at least one surfaces of the first and second rubber component each comprising a sulfur cross-linkable electrically conductive rubber composition, whereby the piezoelectric polymer is sandwiched between the at least one surfaces of the first and second rubber component, and cross-linking.

11. The method according to claim 10, wherein the piezoelectric polymer and the first and second rubber component comprising a sulfur cross-linkable electrically conductive rubber composition each have the form of a layer, and wherein in step e) the piezoelectric polymer layer is sandwiched between the conductive rubber layers, and cross-linking results in a three-layered piezoelectric device, wherein the three-layered piezoelectric device is attached using an adhesive to an inner liner of a tyre.

12. The method according to claim 10, wherein the piezoelectric polymer and the first rubber component comprising a sulfur cross-linkable electrically conductive rubber composition have the form of a layer and the second rubber component is a rubber component comprising a sulfur cross-linkable electrically conductive rubber composition of a tyre.

13. The method according to claim 10, wherein the piezoelectric polymer and first and second rubber component each have the form of a layer, and wherein the second rubber component has a second surface contacting an electrically conductive or non-conductive rubber component of a tyre.

14. The method according to claim 12, wherein the rubber component of the tyre is an inner liner.

15. A tyre comprising a piezoelectric device, obtained by the method according to claim 1.

* * * * *